United States Patent
Florio et al.

(10) Patent No.: US 6,916,741 B2
(45) Date of Patent: Jul. 12, 2005

(54) CAPTURE COMPOUNDS FOR ELECTRONIC PLATING COMPOSITIONS AND ELECTRONIC PACKAGING DEVICE MANUFACTURE

(75) Inventors: Steven M. Florio, Hopkinton, MA (US); Gary S. Calabrese, North Andover, MA (US); Jeffrey Doubrava, Upton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 185 days.

(21) Appl. No.: 09/850,911

(22) Filed: May 8, 2001

(65) Prior Publication Data

US 2002/0004145 A1 Jan. 10, 2002

Related U.S. Application Data

(60) Provisional application No. 60/202,393, filed on May 8, 2000.

(51) Int. Cl.$^7$ ............................................... H01L 21/44

(52) U.S. Cl. .................. 438/687; 438/678; 438/677
(58) Field of Search ................. 438/678, 687, 438/677

(56) References Cited

U.S. PATENT DOCUMENTS

| 4,636,441 A | * | 1/1987 | Sirinyan et al. | 428/447 |
| 5,059,243 A | * | 10/1991 | Jagannathan et al. | 106/1.26 |
| 5,389,496 A | * | 2/1995 | Calvert et al. | 430/315 |
| 5,468,597 A | * | 11/1995 | Calabrese et al. | 430/315 |

* cited by examiner

*Primary Examiner*—Caridad Everhart
(74) *Attorney, Agent, or Firm*—Peter F. Corless; Darryl P. Frickey; Edwards & Angell, LLP

(57) ABSTRACT

The invention relates to use of capture compounds such as a crown ether to facilitate selected compositions and processes employed in manufacture of electronic packaging devices such as printed circuit boards, semiconductor integrated circuit systems, multichip modules, lead frames and other interconnection devices, flat panel display substrates, and the like.

9 Claims, No Drawings

CAPTURE COMPOUNDS FOR ELECTRONIC PLATING COMPOSITIONS AND ELECTRONIC PACKAGING DEVICE MANUFACTURE

This application claims the benefit of U.S. Provisional Application No.: APPLICATION NO.: FILING DATE 60/202,393 filed May 8, 2000.

BACKGROUND OF THE INVENTION

1. Field of the Invention

The present invention relates to use of capture compounds such as a crown ether to facilitate selected compositions and processes employed in manufacture of electronic packaging devices such as printed circuit boards, semiconductor integrated circuit systems, multichip modules, lead frames and other interconnection devices, flat panel display substrates, and the like.

2. Background

A variety of electronic packaging devices are produced through sequential chemical processing, such as substrate catalysis for subsequent metal plating; electroless and/or electrolytic plating of numerous metals such as copper, nickel, gold, etc.; photolithographic processing; etc.

For example, in the manufacture of computer printed circuit boards, copper electrical connections are provided between various board layers by plating board through holes whereby a thin conductive copper conductive is first applied, typically using electroless copper plating techniques, followed by electroplating copper from acid copper solutions.

Copper plating is also employed in circuit board manufacture to plate outer layers where final circuitry is defined. For such applications, panel plating is typically employed, where the full circuit board surface is copper plated followed by photodefining circuitry with a photoresist and then etching in a subtractive process. Alternatively an additive process can be employed, where copper circuits are produced by plating between lines defined by a resist relief image.

Plating of copper, gold and other metals is also employed in semiconductor chip manufacture. In particular, more recently, copper plating also has been employed in semiconductor chip manufacture to provide chip interconnections. Traditionally, semiconductors have been interconnected through aluminum conductors. However, industry continually demands enhanced performance, including ultra large-scale integration and faster circuits. Consequently, chip interconnects are required at dimensions of 200 nm and less. At such geometries, the resistivity of aluminum (theoretically $2.65 \times 10^{-8}$ ohm/meter at room temperature) is considered too high to allow the electronic signal to pass at required speeds. Copper, with a theoretical resistivity of $1.678 \times 10^{-8}$ ohm/meter, is considered a more suitable material to meet the next generation of semiconductor microchips.

Typical processes for defining semiconductor chip interconnects, particularly aluminum interconnects, have involved reactive ion etching of metal layers, e.g. a process that includes metal deposition, photolithographic patterning, line definition through reactive ion etching and dielectric deposition. In Cu-based systems, reactive ion etching is not practical, however, as a result of the paucity of copper compounds with vapor pressures sufficient to enable removal of the copper as may be desired.

Consequently, alternative strategies have developed, such as the Damascene process. That process starts with deposition of dielectric typically by chemical vapor deposition of silicon materials or organic dielectrics followed by curing, or spin coating silicon materials or organic dielectrics. Patterning by photolithographic processes and reactive ion etching defines the vias and trenches (interconnects) in the dielectric. Barrier layers are then formed by chemical vapor deposition or other methods to isolate the copper lines from the dielectric. Copper is then deposited and excess material removed by chemical or mechanical polishing processes.

Although conventional copper plating systems can be suitable for plating vias and trenches as small as 300 nm with 4:1 aspect ratios, defects such as seams, voids and inclusions can occur with conventional methods when attempting to plate features that are smaller or have higher aspect ratios. Accordingly, the need exists high performance copper and other metal plating compositions that can effectively plate (i.e. reduced or absence of such seams, voids and inclusions) such features.

It thus would be desirable to have new electroplating compositions. It would be particularly desirable to have new copper electroplating compositions that can plate effectively (e.g. absence of voids, inclusions and seams) high aspect ratio apertures, including high aspect ratio microvias as discussed above.

SUMMARY OF THE INVENTION

The invention provides use of capture compounds to facilitate and enable various compositions and processes employed in manufacture of electronic packaging devices.

More particularly, in a first aspect, the invention provides improved plating compositions and plating methods particularly useful for electronic device manufacture, such as manufacture of printed circuit boards, semiconducter chip systems, multichip modules, lead frames and other interconnection devices, flat panel display substrates, and the like. The invention includes both electroless and electrolytic compositions and methods for plating copper, gold, nickel and other metals used in electronic device manufacture.

The plating compositions and methods of the invention can be characterized in part by the use of a capture or inclusion-type compound that can complex with one or more other components of the plating composition. Such capture compounds preferably complex ionic species such as a metal ion. Exemplary capture compounds include polyheteroalkyls such as oligomers or polymers that comprise one or more of an alkyl ether, alkyl thioether or alkylamine. Crown ether compounds can be particularly suitable.

The capture compound can complex selected plating composition components to thereby enhance properties of the deposited metal plate. For instance, the effective concentration (i.e. concentration available for deposition) of the active metal species (e.g. copper or gold salt) can be modulated by periodic additions of a capture compound to the plating composition.

More generally, the capture compound can be employed to solubilize materials used in the plating protocol, such as a plating catalyst, e.g. a tin/palladium compound that may be employed in an electroless or electrolytic plating procedure; a plating metal salt as discussed; and the like.

The capture compound also can be employed to remove a targeted compound or ionic species from an active plating bath to thereby facilitate the plating reaction. For example, an end product of a plating reaction can be complexed with an added capture compound to thereby drive the plating reaction to a desired level of completion.

In a related aspect, the invention provides for removal of targeted materials from an electronic chemical composition by use of a capture molecule. Removal of a plating reaction end product as discussed above is an example of this aspect of the invention. Capture compounds also may be employed to purify crude materials such as plating catalysts, metal salts and the like prior to use in plating protocol. Capture compounds also may be employed to isolate and/or remove targeted materials from a a spent plating solution, or other chemical composition used in electronic device manufacture. For instance, a spent copper, gold, nickel electroless or electrolytic plating solution can be passed through a filter or column containing one or more capture compounds and the metal contained in the spent solution thereby isolated and recovered.

In a further aspect, the invention provides for use of a capture compound as a type of active component in plating, photolithography or other chemical process involved in electronic device manufacture. For instance, one or more capture compounds can be employed as a type of seed or activation layer and applied to a substrate surface, e.g. a resin or dielectric layer or an electroless copper deposit to plate through-holes of a printed circuit board, or for plating-on-plastic applications, or on glass or plastic such as for flat panel display manufacture. The capture compound then can promote subsequent deposition and adhesion of additional materials such as a plating catalyst e.g. a palladium or platinum catalyst compound or composition for electroless or electrolytic metal deposition, particularly copper, gold or nickel plating. The capture compound can provide adhesion promotion for other materials e.g. of a subsequently applied organic layer, such as an organic antireflective coating layer and/or photoresist layer used in a photolithography process.

In such seed layer or adhesion promotion applications, a capture compound is suitably applied as a liquid coating composition to a substrate surface, e.g. as an organic solvent solution wherein the organic solvent is removed by heating after application to the substrate. One or more capture compounds may be formulated as a solution with any of a number of organic solvents such as a ketone e.g. 2-heptanone; a lactate such as methyl or ethyl lactate; a propionate such as ethyl ethoxy propionate; an alcohol such as methanol, ethanol or isopropanol; and the like. Capture compounds also may be formulated as aqueous solutions, optionally with one or more surfactants and one or more water-miscible organic solvents such as alcohol, e.g. methanol, ethanol and/or isopropanol.

The invention also include use of photosensitive capture compounds that will enable selective patterning through exposure to activating radiation through a photomask.

Further provided are articles of manufacture that contain one or more capture compounds. The capture compound(s) may be present as a coating layer on a substrate. For example, the invention includes electronic device substrates such as a printed circuit board, microelectronic wafer, multichip module, lead frame substrate or other interconnection device, flat panel display substrate, and the like that comprises one or more capture compounds coated thereon. Thus, a printed board may contain a coating layer of one or more capture compounds applied on through-hole walls, either over a resin layer or a primary metal deposit such as may be provided by electroless copper deposition. That capture molecule layer can serve to promote subsequent metal deposition. A microelectronic wafer, e.g. a silicon-based wafer, also may comprise a capture compound such as to promote subsequent copper deposition to provide electrical interconnection on the chip system.

Other aspects of the invention are disclosed infra.

DETAILED DESCRIPTION OF THE INVENTION

As stated above, the invention provides use of capture compounds to facilitate selected compositions and processes employed in manufacture of electronic packaging devices.

A variety of materials may be suitably employed as capture compounds for use in accordance with the invention. Suitable materials include polyheteroalkyls such as oligomers or polymers that comprise one or more of an alkyl ether, alkyl thioether or alkylamine. Suitable materials include those compounds that comprise other functional groups that are capable of ligating or complexing with ionic species or other targeted materials. More particularly, suitable compounds may include one or more preferably a plurality of hydroxy, nitro, cyano, optionally substituted amino, sulfono, sulfinyl or other polar moiety. Generally preferred capture compounds are large ring cyclic structures, e.g. having 8, 9, 10, 12 or more ring members, with one or preferably a plurality such as 2, 3, 4, 5 or more polar functional groups spaced through the cyclic structure. Suitable spacer groups can be alkyl (i.e. alkylene linkers) or aryl such as phenyl or naphthyl linker groups, or a combination of aliphatic and aromatic linkers. Generally preferred capture compounds have a molecular weight of at least about 50, more typically at least about 60, 70, 80, 0, 100, 120, 140, 150, 170, 200, 300 or 500. Higher molecular weight polymeric materials also may be suitable, e.g. polymers having such polar functional groups and molecular weights (weight average) of at least about 1000, 1500, 2000, 3000, 4000 or 5000. Capture compounds having a molecular weight in excess of about 10,000 are generally less preferred.

Such compounds are commercially available or can be synthesized by known procedures. For instance, suitable crown ether compounds such as 18-crown-6 are commercially available. Suitable capture compounds also are disclosed in U.S. Pat. Nos. 5,071,819; 5,393,892; 5,547,760; 5,796,496 5,980,987; and International Application PCT/US97/11054 (WO 97/49492).

Suitable and preferred capture compounds for a specific application also can be readily identified by simple testing. That is, a candidate capture compound may be employed in the application and performance evaluated.

Capture compounds may be employed in a variety of ways in accordance with the invention. For many applications, such as removal of a targeted material from a mixture, it may be preferred to link (e.g. covalent linkage) the capture compound to a solid support such as a synthetic material e.g. a nylon; a cellulose material; and the like. The linked capture compound then may be used as a filter, column packing material, etc., and the crude mixture passed over the linked capture compound to thereby isolate the targeted material. The capture compound may be linked to the solid support by a variety of groups, e.g. amide, ester, etc.

As discussed above, for other applications, a capture compound may be formulated as an organic solvent or aqueous liquid coating composition and applied to a substrate surface.

As also discussed, one or more capture compounds may be added as an additional component of a composition such as a plating bath.

Exemplary electrolytic plating compositions and methods that may be used together with one or more capture compounds in accordance with the invention are described in e.g. U.S. Pat. Nos. 6,017,967; 5,858,198; 5,800,739; 5,395, 652; 5,391,421; 5,276,290; 5,252,196; 5,238,550; 5,164,069; 5.068,013; 5,302278; 5,085,744; 4,399,006; and 4,247,372.

Exemplary electroless plating compositions that may be used together with one or more capture compounds in accordance with the invention are described in e.g. U.S. Pat. Nos. 5,288,313; 5,203,911; and 4,919,720.

A capture molecule is suitably added (in those applications where the capture compound is an additional composition component) to a copper or other metal plating bath in concentrations ranging from about 1 to 10,000 ppm based on the weight of the bath, although other concentrations also may be suitable. Suitable and preferred concentrations of a capture compound in any particular plating composition, or other application in accordance with the invention, may be readily determined empirically by simple testing at differing capture compound concentration levels.

A wide variety of substrates and compositions may be treated and processed in accordance with the invention, as discussed above.

Thus, for example, various components employed in compositions used for electronic device manufacture may be treated (purified) with one or more capture compounds. A composition that has been or is being employed in an electronic device manufacture process also may be treated with one or more capture compounds, e.g. to remove or isolate waste products or impurities, or to provide an effective concentration of one or more active reagents in the process such as where the capture compound acts as a solublizing agent. The capture compound(s) also function as a seed layer, coupling agent, or adhesion promoting layer.

The compositions of the invention are particularly useful to plate difficult work pieces, such as circuit board substrates with small diameter, high aspect ratio microvias and other apertures. The plating compositions of the invention also will be particularly useful for plating integrated circuit devices, such as formed semiconductor devices and the like.

All documents mentioned herein are fully incorporated herein by reference.

What is claimed is:

1. A method for manufacture of a microelectronic semiconductor wafer substrate, comprising:

contacting the surface of the microelectronic semiconductor wafer substrate with one or more polyheteroaryl capture compounds, applying an organic coating layer over the one or more capture compounds on the microelectronic semiconductor wafer substrate, and electrolytically plating metal on the microelectronic wafer substrate.

2. The method of claim 1 wherein the organic coating layer is a microlithography antireflective layer.

3. The method of claim 1 wherein the organic coating layer is a photoresist layer.

4. The method of claim 1 wherein the copper is electrolytically plated on the substrate.

5. The method of claim 1 wherein gold is electrolytically plated on the substrate.

6. The method of claim 1 wherein polyheteroaryl capture compounds comprise oligomers or polymers that comprise one or more of an alkyl ether, alkyl thioether or alkylamine.

7. The method of claim 1 wherein polyheteroaryl capture compounds comprise oligomers or polymers that comprise one or more of an alkyl ether.

8. The method of claim 1 wherein polyheteroaryl capture compounds comprise oligomers or polymers that comprise one or more of an alkyl thioether.

9. The method of claim 1 wherein polyheteroaryl capture compounds comprise oligomers or polymers that comprise one or more of an alkylamine.

* * * * *